Figure 1:
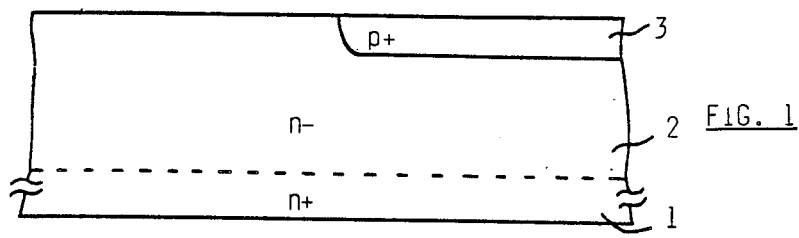

United States Patent [19]

Musumeci et al.

[11] Patent Number: 4,889,822
[45] Date of Patent: Dec. 26, 1989

[54] MANUFACTURING PROCESS FOR A MONOLITHIC INTEGRATED SEMICONDUCTOR DEVICE HAVING MULTIPLE EPITAXIAL LAYERS WITH A LOW CONCENTRATION OF IMPURITIES

[75] Inventors: Salvatore Musumeci, Riposto; Raffaele Zambrano, Mercato S. Severino, both of Italy

[73] Assignee: SGS-Thomson Microelectronics S.p.A., Catania, Italy

[21] Appl. No.: 241,269

[22] Filed: Sep. 7, 1988

[30] Foreign Application Priority Data

Sep. 7, 1987 [IT] Italy .................................. 6621 A/87

[51] Int. Cl.$^4$ ............................................ H01L 21/20
[52] U.S. Cl. ......................................... 437/31; 437/30; 437/26; 437/51; 437/59; 437/151
[58] Field of Search ....................... 437/51, 54, 55, 30, 437/31, 154, 59, 27, 61, 63, 64, 81, 95, 228; 357/46, 48, 51; 148/DIG. 126

[56] References Cited

U.S. PATENT DOCUMENTS 3,663,872  5/1972  Yanagawa ............................. 437/51
4,161,417  7/1979  Yim et al. ............................. 437/31
4,213,806  7/1980  Tsang ................................... 437/154
4,667,393  5/1987  Ferla et al. ........................... 437/31
4,721,684  1/1988  Musumeci ............................. 437/30
4,780,430 10/1988  Musumeci et al. .................... 437/51

FOREIGN PATENT DOCUMENTS 2131993  1/1973  Fed. Rep. of Germany .

Primary Examiner—Brian E. Hearn
Assistant Examiner—Tom Thomas
Attorney, Agent, or Firm—Birch, Stewart, Kolasch & Birch

[57] ABSTRACT

The invention concerns a process for manufacturing a monolithic integrated semiconductor device comprising an integrated control circuit and high-voltage power components. It solves the problem of undesired phantom layers created by out diffusion of the type-P dopant present in the insulation region of the substrate. Between a first epitaxial layer and a third epitaxial layer of the device, a second epitaxial layer is grown of predetermined thickness, and a first region for the insulation of the integrated control citcuit is formed in the first epitaxial layer and at least a second region for the buried layer is formed in the second eiptaxial layer.

7 Claims, 3 Drawing Sheets

MANUFACTURING PROCESS FOR A MONOLITHIC INTEGRATED SEMICONDUCTOR DEVICE HAVING MULTIPLE EPITAXIAL LAYERS WITH A LOW CONCENTRATION OF IMPURITIES

The present invention concerns a process for manufacturing a monolithic integrated semiconductor device and, in particular, a device comprising an integrated control circuit and high voltage power components associated together, on a single chip of semiconductor material.

It is well known that to produce a device of this kind the region where the integrated circuit controlling the power stage is produced must be electrically insulated from the common substrate. It is further known that, to reduce the value of the collector series resistance of transistors in the integrated control circuit, a buried layer is formed under the collector region of said transistors.

If said buried layer is formed on a layer heavily doped with impurities of opposite conductivity, constituting the insulating layer between said buried layer and the common substrate, on account of the "out diffusion" phenomenon, the dopant present in the insulating layer beneath the buried layer diffuses into the buried layer above it and into the collector region. Modifications may take place in that part of the collector region of the transistors in the integrated control circuit which is adjacent to the buried layer, due to formation there of undesired and harmful "intermediate" layers, also called phantom layers. Conductivity of such layers is in fact opposite to the one required in a buried layer and in the collector region above it. A circumstance of this kind is found to be more marked and damaging in the case of devices that have to withstand high voltages, such devices requiring high-resistivity collector regions.

Because of the harmful effects referred to above, much effort has been spent to reduce out diffusion or at least to prevent it having an effect. After growth of a first epitaxial layer on the substrate, manufacturing techniques include formation, in said first layer, of the horizontal region of insulation followed by formation of one or more buried layers and then by a further growth of a second epitaxial layer.

If this latter epitaxial layer needs to be highly resistive, namely if it must have concentrations of impurities of the order of $10^{14}$ atoms/cm$_3$, there is a risk of phantom layers being formed.

The purpose of the present invention is to suggest a process for manufacturing a monolithic integrated high-voltage semiconductor device which the formation of avoids phantom layers and, at the same time, provides excellent characteristics both for the high-voltage power transistors and for the transistors in the integrated control circuit. According to the invention these goals can be achieved by means of a manufacturing process which provides a monolithic integrated semiconductor device comprising at least one power transistor and one integrated control circuit, and characterized in that between a first epitaxial layer and a third epitaxial layer of the device, a second epitaxial layer is grown of predetermined thickness, and in that a first region for insulation is formed in the first epitaxial layer and at least a second region for the buried layer is formed in the second epitaxial layer.

Figure 6:
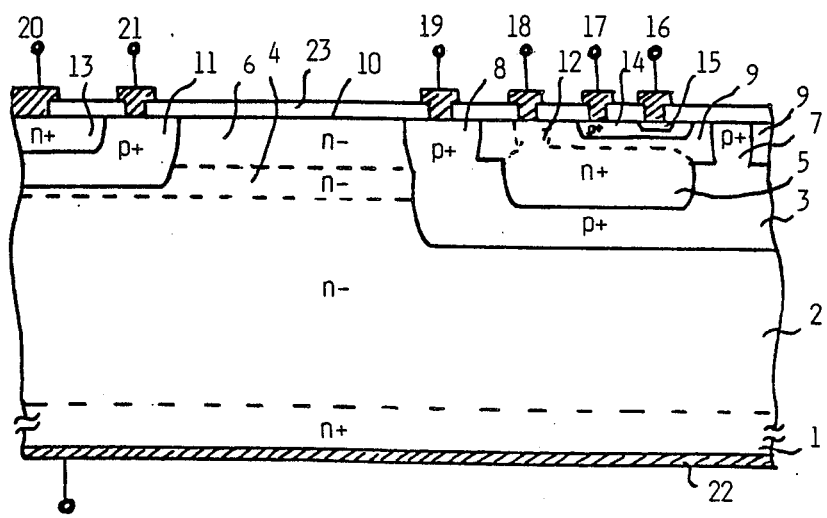
Figure 7:
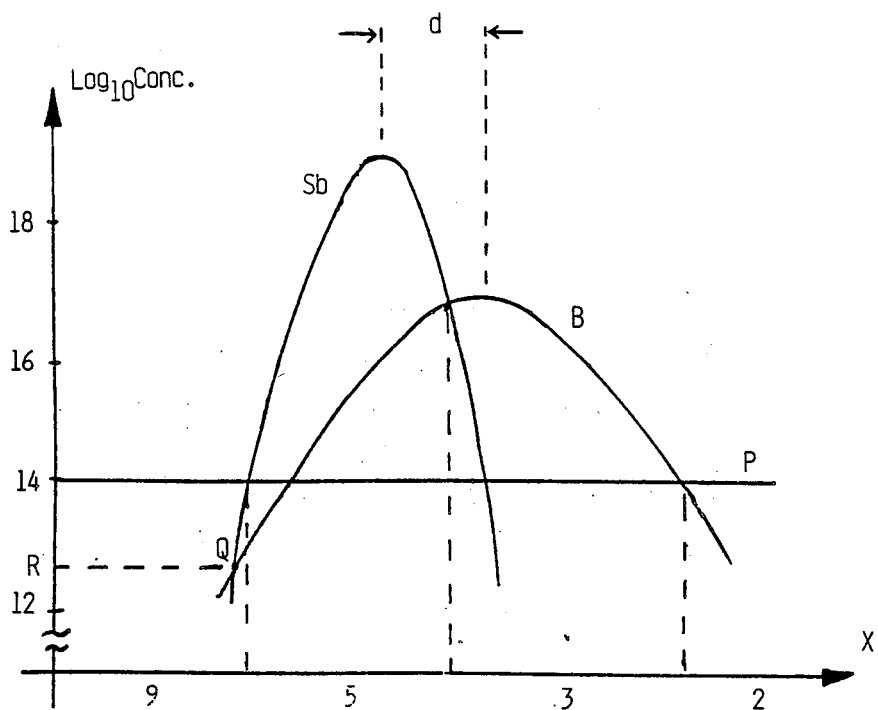

The invention will be made clearer by the following detailed description of one of its possible embodiments, limiting the invention, read together with the attached drawings wherein:

FIGS. 1–6: represent sectional views, not drawn to scale, of a portion of a device comprising a bipolar power transistor and a bipolar transistor in the integrated control circuit during successive stages of the manufacturing process according to the invention;

FIG. 7: shows three curves representing the distribution of three doping impurities in one section (not drawn to scale) of the device in FIG. 6, passing through a buried layer and regions above and below it of a transistor in the integrated control circuit.

Referring to FIGS. 1–6 a manufacturing process according to the invention is described below for a semiconductor device comprising a bipolar power transistor and an integrated control circuit. In order to simplify the explanations the figures show a bipolar transistor. The process according to the invention comprises the following sequential stages of manufacture:

Stage A—On a silicon single crystal substrate 1, N+ doped at a high concentration of impurities, an epitaxial growth is made forming a first epitaxial layer 2, N− doped with phosphorus. The epitaxial layer 2 has a concentration of impurities of $10^{14}$ atoms/cm$^3$, typical of a collector region in a high-voltage transistor (FIG. 1).

Stage B—By means of normal processes such as photomasking, etching, implantation and diffusion, a region 3, P+ doped with boron, is formed in the epitaxial layer 2, more precisely in an area of the chip to be used for the integrated control circuit. The surface of region 3, with its concentration of impurities of $5 \times 10^{16}$ atoms/cm$^3$, constitutes the region of horizontal insulation of the integrated control circuit components (FIG. 1).

Figure 2:
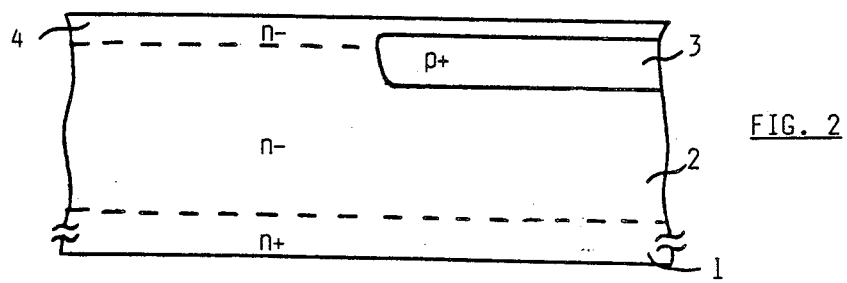

Stage C—According to the invention a second epitaxial growth is made of silicon, N− doped with phosphorus, to form a second epitaxial layer 4 over the whole chip. This layer is of predetermined thickness and has a concentration of impurities of $10^{14}$ atoms/cm$^3$, identical to that of the first epitaxial layer 2 below it (FIG. 2).

Figure 3:
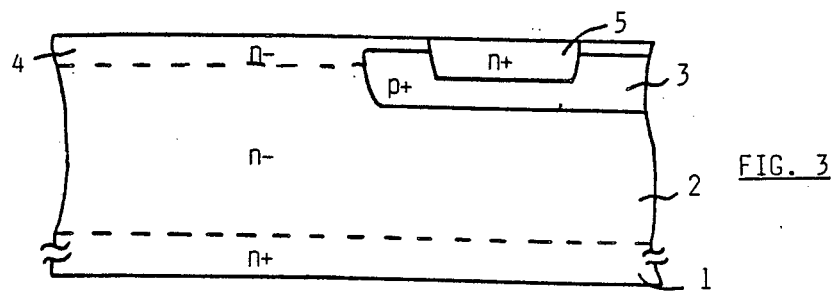

Stage D—By means of oxidation, photo-masking, etching, implantation and diffusion, N+ antimony-doped buried layers 5 are formed according to the invention, in a second epitaxial layer 4, in areas of the chip destined for components of the integrated control circuit comprised in the insulation region 3. Each of said layers has a concentration of impurities, on the surface of the epitaxial layer 4, of $2 \times 10^{19}$ atoms/cm$^3$ (FIG. 3).

Stage E—Again according to the invention, a third epitaxial growth of silicon, N− doped with phosphorus, forms a third epitaxial layer over the entire chip. The concentration of impurities in this layer is $10^{14}$ atoms/cm$^3$ identical to that of the underlying epitaxial layers 4 and 2 (FIG. 4).

Figure 4:
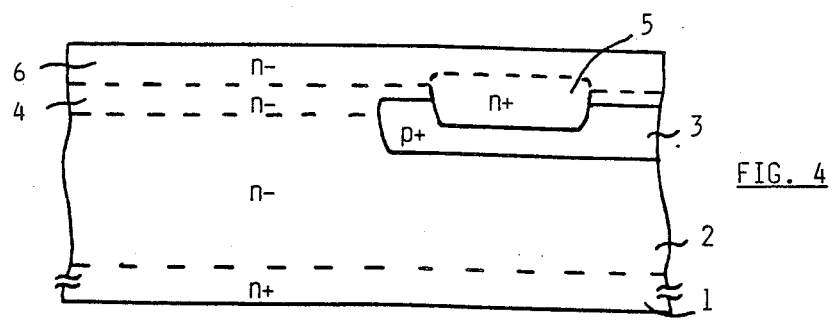
Figure 5:
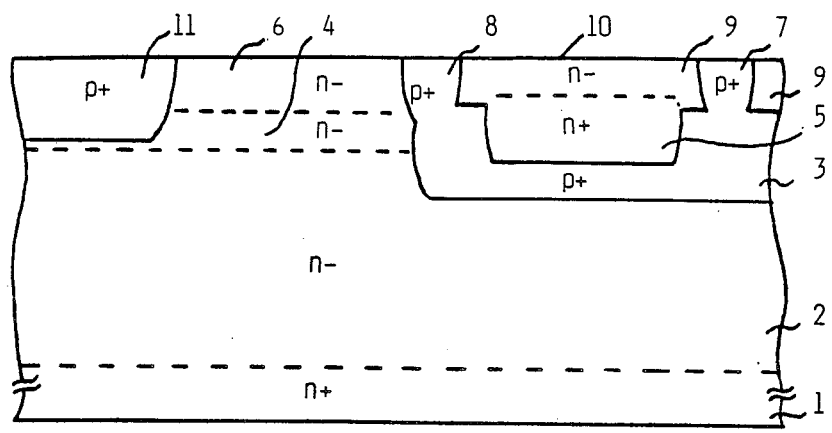

It must be clarified that the three epitaxial layers 2, 4 and 6, indicated separately by horizontal broken lines in FIGS. 4–6, in actual fact form one single thick layer which, together with the substrate 1, make up the collector region of the bipolar power transistor. It must be further explained that each buried layer 5 assumes the shape seen in FIGS. 4–6 due to the effect of the third epitaxial growth 6 and also to high temperature processes taking place at later manufacturing stages of the device.

Stage F—At this point manufacturing continues with well-known processes.

By oxidation, photo-masking, etching, implanation and diffusion, P+ doped vertical insulation regions 7 and 8 are formed; starting from the surface 10, these pass through the third 6 and second 4 epitaxial layers, extending and joining up with the horizontal insulation region 3 delimiting, within themselves, collector region 9 and transistors of the integrated circuit of control. In this way said transistors are insulated from one another and from the rest of the chip. By the usual processes mentioned above a P+ doped region 11 is formed constituting the base of the power transistor (FIG. 5).

Stage G—Regions 12 and 13, both N+ doped, are then made and respectively constitute the so-called "sinker" that serves to reduce the value of the collector series resistance of the transistor in the integrated control circuit, and the power transistor emitter (FIG. 6).

Stage H—Formation then follows of the P+ doped diffused base region 14 and of the N+ doped emitter 15 of the transistor in the integratd control circuit (FIG. 6.).

Stage I—Lastly, metal contacts are made for the electrodes of the emitter 16, base 17, and collector 18 of the transistor in the integrated control circuit, for the electrode 19 in the insulation region and for the electrodes of the emitter 20, base 21 and collector 22 of the power transistor, as well as metal connecting tracks (not shown in the figure) on the insulating layer 23 of the chip (FIG. 6.).

For a more accurate evaulation of the effects of the process according to the invention, and for ascertaining how its main purpose, namely that of avoiding formation of harmful phantom layers, has been entirely fulfilled, reference may be made to FIG. 7. This figure shows three curves representing the trend of concentrations of three doping impurities—antimony (Sb), boron (B) and phosphrus (P)—in one section, not drawn to scale, passing through a buried layer 5 and through the overlying collector region 9 of a transistor in the integrated control circuit of the device made according to the invention, seen in FIG. 6, also through the insulation region 3 and through a part of the first epitaxial layer 2 underneath said region 3.

As already explained in the example described, concentrations of the first 2, second 4 and third 6 epitaxial layers are identical at $10^{14}$ atoms/cm$^3$ of phosphorus (straight line P). Concentration in the epitaxial collector region 9 is the same. Boron (curve B) is the impurity used in forming the insulation region 3 of components in the integrated control circuit. Antimony (curve Sb) is the impurity used to form the buried layer of the above mentioned transistor in the integrated control circuit.

Peaks of boron B and antimony Sb concentrations are separated by a distance "d" created by the predetermined thickness of the second epitaxial layer 4, since diffusion of boron B takes place starting from the surface of the first epitaxial layer 2 (FIG. 1) and since diffusion of antimony Sb takes place starting from the surface of the second epitaxial layer 4 (FIG. 3).

Because of this the value at which concentrations of boron B and antimony Sb are equal in the third epitaxial layer 6, identified by the ordinate R of point Q in FIG. 7, is decidedly lower than that of the phosphorus concentration P with which all the epitaxial layers have been equally doped, particularly the epitaxial collector region 9. This ensures absence of phantom layers in the above collector region 9, especially in that part of it in direct contact with the underlying buried layer 5.

The above statement remains true down to a minimum thickness "$d_{min}$" of the second epitaxial layer 4; this is because the ordinate R of point Q is less than the value of the predetermined concentration of the doping phosphorus (P) of the third epitaxial layer 6. Further, it is still true whatever the concentration of dopant may be in the third epitaxial layer 6, even if smaller than that present in the second layer 4 and in the first layer 2.

No limit is placed on the invention by equality of doping concentrations in the three epitaxial layers. Phosphorus concentrations in the three epitaxial layers, seen as equal in FIG. 7, can in fact be different.

Although only one form of execution of the present invention has been explained and described, it is clear that numerous variations and modifications can be made to it without departing from the scope of the invention. For example, a buried layer 5 can be formed using aresenic as an impurity in place of antimony Sb since the concentration profiles of said doping agents take on an almost identical appearance.

To give another example, the invention applies to devices that comprise power components which are more complex than a single bipolar power transistor, of the type of bipolar power transistors in a Darlington configuration.

Again, the power component associated to the integrated control circuit on the same chip of semiconductor material may consist of a MOS type power transistor and, in that case, the process for manufacturing the device undergoes the necessary modifications, known to persons skilled in the art, for formation of the above-mentioned MOS transistor.

We claim:

1. A manufacturing process for a monolithic integrated semiconductor device comprising at least one power transistor and an integrated control circuit integrated on a single chip of semiconductor material, comprising the following steps:

growing on a single crystal substrate a first epitaxial layer having a first type of conductivity, obtained by means of doping with a first dopant;

doping the first epitaxial layer with a second dopant;

forming a first region in said first epitaxial layer having a second type of conductivity opposite to the first type of conductivity;

growing a second epitaxial layer having the first type of conductivity, obtained by doping with the first dopant, in such a way that said second epitaxial layer entirely covers the first epitaxial layer and the first region;

forming at least a second region by doping the second epitaxial layer with a third dopant having the first type of conductivity, so that said second region is comprised within the first region;

growing a third epitaxial layer having the first type of conductivity by doping with the first dopant so that said third epitaxial layer entirely covers the second epitaxial layer and the second region;

forming at least one isolation region, having the second type of conductivity, that passes through the third and second epitaxial layers until it reaches the first region and delimits within it at least a first portion of the thrid and second epitaxial layers;

forming within said first portion, delimited by the isolation region, elements of the integrated control circuit;

forming one or more power transistors on the same chip; and forming electrodes on the front and back of the chip and metal interconnecting tracks among elements of the integrated control circuit and at least one power transistor on the front of the chip.

2. The process according to claim 1, wherein the second epitaxial layer has a thickness d which is larger than a minimum thickness $d_{min}$, said minimum thickness $d_{min}$ being determined by the circumstance at which the value at the point at which the concentrations of the second and third dopants in the third epitaxial layer are equal is equal to the value of the concentration of said first dopant in said third epitaxial layer.

3. The process according to claims 1 or 2, wherein said third epitaxial layer is formed with a concentration of dopants not larger than that of said second epitaxial layer.

4. The process according to claim 2, wherein said first dopant is phosphorus, said second dopant is boron, and said third dopant is antimony.

5. The process according to claim 2, wherein said first type of conductivity is N and said second type of conductivity is P.

6. The process according to claims 1 or 2, wherein said third epitaxial layer is formed with a concentration of dopants not smaller than that of said second epitaxial layer.

7. The process according to claim 1, wherein said first dopant is phosphorus, said second dopant is boron, and said third dopant is antimony.

* * * * *